(12) United States Patent
Tseng et al.

(10) Patent No.: US 8,956,909 B2
(45) Date of Patent: Feb. 17, 2015

(54) METHOD OF FABRICATING AN ELECTRONIC DEVICE COMPRISING PHOTODIODE

(71) Applicant: Unimicron Technology Corporation, Taoyuan (TW)

(72) Inventors: Tzyy-Jang Tseng, Taoyuan (TW); Dyi-Chung Hu, Taoyuan (TW)

(73) Assignee: Unimicron Technology Corporation, Taoyuan (TW)

(*) Notice: Subject to any disclaimer, the term of this patent is extended or adjusted under 35 U.S.C. 154(b) by 0 days.

(21) Appl. No.: 14/138,968

(22) Filed: Dec. 23, 2013

(65) Prior Publication Data

US 2014/0110713 A1 Apr. 24, 2014

Related U.S. Application Data

(63) Continuation-in-part of application No. 13/183,816, filed on Jul. 15, 2011, now Pat. No. 8,835,992.

(30) Foreign Application Priority Data

Jul. 16, 2010 (TW) .............................. 99123521 A

(51) Int. Cl.
*H01L 21/00* (2006.01)
*H01L 31/20* (2006.01)
*H01L 27/146* (2006.01)

(52) U.S. Cl.
CPC ........ *H01L 31/202* (2013.01); *H01L 27/14645* (2013.01); *H01L 27/14625* (2013.01);

(Continued)

(58) Field of Classification Search
CPC ............... H01L 27/14627; H01L 27/14621; H01L 27/14625; H01L 27/1464; H01L 27/14636; H01L 27/14645
USPC ................................................ 438/69, 70, 72
See application file for complete search history.

(56) References Cited

U.S. PATENT DOCUMENTS

| 8,120,081 B2 | 2/2012 | Murakoshi |
| 8,207,590 B2 | 6/2012 | Park et al. |

(Continued)

FOREIGN PATENT DOCUMENTS

| CN | 101359656 | 2/2009 |
| CN | 101752267 | 6/2010 |

(Continued)

*Primary Examiner* — Ngan Ngo
(74) *Attorney, Agent, or Firm* — Mintz Levin Cohn Ferris Glovsky and Popeo, P.C.; Peter F. Corless; Steven M. Jensen

(57) ABSTRACT

An electronic device and a method of fabricating the same are provided. The electronic device includes: a photodiode layer; a wiring layer formed on the first surface of the photodiode layer; a plurality of electrical contact pads formed on the wiring layer; a passivation layer formed on the wiring layer and the electrical contact pads; an antireflective layer formed on the second surface of the photodiode layer; a color filter layer formed on the antireflective layer; a dielectric layer formed on the antireflective layer and the color filter layer; and a microlens layer formed on the dielectric layer, allowing the color filter layer, the dielectric layer and the microlens layer to define an active region within which the electrical contact pads are positioned. As the electrical contact pads are positioned within the active region, an area of the substrate used for an inactive region can be eliminated.

6 Claims, 5 Drawing Sheets

(52) U.S. Cl.
CPC ..... *H01L27/14621* (2013.01); *H01L 27/14627* (2013.01); *H01L 27/14629* (2013.01); *H01L 27/14632* (2013.01); *H01L 27/14636* (2013.01); *H01L 27/1464* (2013.01)
USPC .................................. 438/69; 438/70; 438/72

(56) References Cited

U.S. PATENT DOCUMENTS

| | | | |
|---|---|---|---|
| 8,760,545 B2* | 6/2014 | Takimoto | 348/294 |
| 2009/0090937 A1 | 4/2009 | Park | |
| 2009/0127599 A1 | 5/2009 | Kim et al. | |
| 2009/0159944 A1 | 6/2009 | Oh | |
| 2009/0197365 A1 | 8/2009 | Kim et al. | |
| 2009/0200625 A1 | 8/2009 | Venezia et al. | |
| 2010/0006969 A1 | 1/2010 | Park et al. | |
| 2010/0096718 A1 | 4/2010 | Hynecek et al. | |
| 2010/0151615 A1 | 6/2010 | Shiau et al. | |
| 2010/0176474 A1 | 7/2010 | Kwon et al. | |
| 2010/0201834 A1 | 8/2010 | Maruyama et al. | |
| 2010/0214454 A1 | 8/2010 | Kikuchi | |
| 2010/0245645 A1 | 9/2010 | Kikuchi | |
| 2010/0285630 A1 | 11/2010 | Lee | |
| 2011/0084350 A1 | 4/2011 | Murakoshi et al. | |
| 2011/0108938 A1 | 5/2011 | Nozaki et al. | |
| 2011/0140221 A1 | 6/2011 | Venezia et al. | |
| 2011/0143485 A1 | 6/2011 | Tazoe | |
| 2011/0223707 A1 | 9/2011 | Hynecek et al. | |
| 2011/0260221 A1 | 10/2011 | Mao et al. | |
| 2012/0009720 A1 | 1/2012 | Shim et al. | |
| 2012/0038014 A1 | 2/2012 | Tai et al. | |
| 2012/0080765 A1 | 4/2012 | Ku et al. | |
| 2012/0217602 A1 | 8/2012 | Enomoto | |
| 2012/0262609 A1 | 10/2012 | Kikuchi | |
| 2012/0267743 A1 | 10/2012 | Nakamura et al. | |
| 2012/0313206 A1 | 12/2012 | Nozaki et al. | |
| 2014/0151835 A1* | 6/2014 | Huang et al. | 257/432 |

FOREIGN PATENT DOCUMENTS

| | | |
|---|---|---|
| CN | 101800233 | 8/2010 |
| TW | 201013907 A | 4/2010 |

* cited by examiner

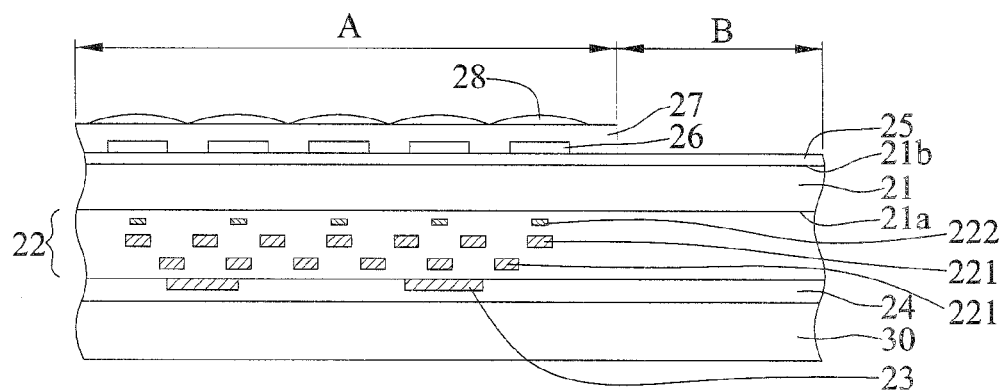
FIG.2G
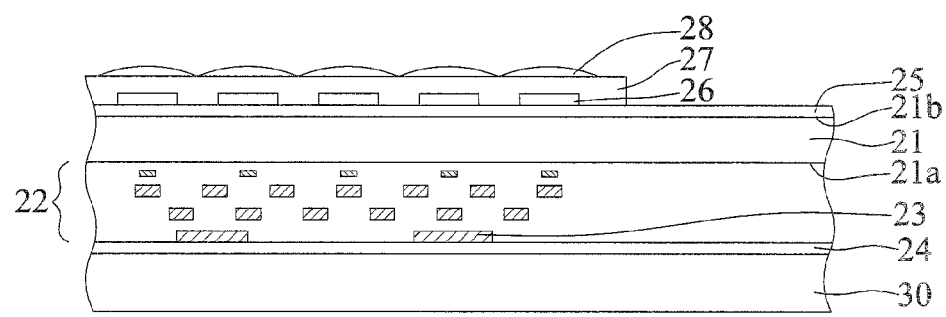
FIG.2G'
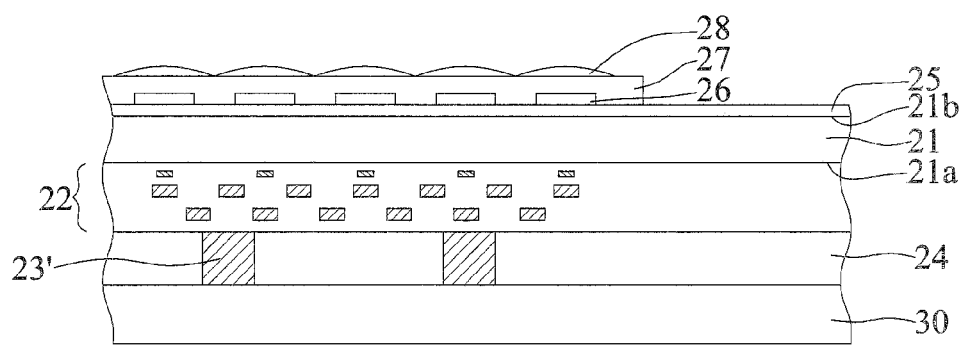
FIG.2G"

US 8,956,909 B2

METHOD OF FABRICATING AN ELECTRONIC DEVICE COMPRISING PHOTODIODE

CROSS-REFERENCE TO RELATED APPLICATIONS

This application is a continuation-in-part application of copending application U.S. Ser. No. 13/183,816, filed on Jul. 15, 2011, which claims under 35 U.S.C. §119(a) the benefit of Taiwanese Application No. 099123521, filed Jul. 16, 2010, the entire contents of which are incorporated herein by reference.

BACKGROUND OF THE INVENTION

1. Field of the Invention

The present invention relates to electronic devices and methods of fabricating the same, and, more particularly, to an electronic device having conductive contact pads and a method of fabricating the same.

2. Description of Related Art

A general electronic component or semiconductor chip is an integrated circuit (IC) capable of processing electronic signals fabricated by forming multiple dielectric layers and metal layers on a silicon substrate. In recent years, a flourished complementary metal oxide semiconductor (CMOS) image sensor is an electronic device constructed on the basis of a standard semiconductor process, which is generally used in the photography module of a digital camera or a mobile phone.

Referring to FIG. 1, a cross-sectional view of an electronic device such as a CMOS image sensor in accordance with the prior art is shown. The electronic device has: a carrier board 10 having a first surface 10a and a corresponding second surface 10b; a first electrical contact pad 11 formed on the first surface 10a; a wiring layer 12 formed on the first surface 10a and the first electrical contact pad 11, the wiring layer 12 being electrically connected to the first electrical contact pad 11; a silicon layer 13 formed on the wiring layer 12; a color filter layer 14 formed on the silicon layer 13; a microlens layer 15 formed on the color filter layer 26, allowing the color filter layer 14 and the microlens layer 15 to define an active region A, wherein a region outside the active region A is an inactive region B, and the first electrical contact pad 11 is positioned outside the active region A; a second electrical contact pad 16 formed on the second surface 10b; a glass layer 17, formed on the second surface 10b and having a opening 170 for exposing the second electrical contact pad 16; and a conductive aperture 1$ penetrating through the carrier board 10 and electrically connected to the first electrical contact pad 11 and the second electrical contact pad 16.

However, since the first electrical contact pad 11 of the electronic device is disposed outside the active region of the electronic device, the whole electronic device occupies a larger area of the substrate (including the carrier, the wire-disposing layer, the silicon layer and the like) and is thus larger in size. That is, the disposition of the first electrical contact pad 11 of the prior art electronic device requires a larger size of the substrate, thereby making the electronic device higher in cost to manufacturer and larger in size. Accordingly, such an electronic device fails to meet the miniaturization requirement for electronic products.

Therefore, it has become a critical issue to be solved as to how to effectively reduce the required size of the substrate.

SUMMARY OF THE INVENTION

In view of the above-mentioned problems of the prior art, the primary object of the present invention is to provide an electronic device having a smaller substrate area and a method of fabricating the same.

In order to achieve the above-mentioned and other objects, the present invention provides an electronic device, comprising: a photodiode layer having corresponding first and second surfaces; a wiring layer formed on the first surface of the photodiode layer, the wiring layer comprising a plurality of wires spaced apart from each other and disposed in a special arrangement and a plurality of transfer gates disposed at positions proximate to the photodiode layer; a plurality of electrical contact pads formed on the wiring layer and electrically connected to the wiring layer; a passivation layer formed on the wiring layer and the electrical contact pads; an antireflective layer formed on the second surface of the photodiode layer; a color filter layer formed on the antireflective layer; a dielectric layer formed on the antireflective layer and the color filter layer; and a microlens layer formed on the dielectric layer, allowing the color filter layer, the dielectric layer and the microlens layer to define an active region within which electrical contact pads are positioned.

In the above-mentioned electronic device, the electrical contact pads can be embedded in the wiring layer and exposed from a surface of the wiring layer. Alternatively, the electrical contact pads are in the shape of a pillar and penetrate the passivation layer.

In the aforementioned electronic device, the photodiode layer can be made of amorphous silicon, and the passivation layer can be made of a material selected from the group consisting of silicon oxide, epitaxial silicon, and polyimide.

In the aforementioned electronic device, a carrier board can be further disposed on the passivation layer.

The present invention further provides a method of fabricating an electronic device, comprising: forming a photodiode layer on a silicon substrate; forming a wiring layer on the photodiode layer, the wiring layer comprising a plurality of wires spaced apart from each other and disposed in a special arrangement and a plurality of transfer gates disposed at positions proximate to the photodiode layer; forming a plurality of electrical contact pads on the wiring layer and electrically connecting the electrical contact pads to the wiring layer; forming a passivation layer on the wiring layer and the electrical contact pads; attaching a carrier board on the passivation layer; removing the silicon substrate; forming an antireflective layer on the photodiode layer; forming a color filter layer on the antireflective layer; forming a dielectric layer on the antireflective layer and the color filter layer; and forming a microlens layer on the dielectric layer, allowing the color filter layer, the dielectric layer and the microlens layer to define an active region within which the electrical contact pads are positioned.

According to the above-mentioned method of fabricating the electronic device, the electrical contact pads can be embedded in the wiring layer and exposed from a surface of the wiring layer. Alternatively, the electrical contact pads can be in the shape of a pillar and penetrate through the passivation layer.

In the above-mentioned method of fabricating the electronic device, the photodiode layer can be made of amorphous silicon, and the passivation layer can be made of a material selected from the group consisting of silicon oxide, epitaxial silicon, and polyimide.

In the method of fabricating the electronic device, a planarization process is further performed to the passivation layer after forming the passivation layer.

In conclusion, the electronic device of the present invention provides the electrical contact pads within the active region. Therefore, as an area of the substrate used for an inactive region can be eliminated, and the electronic device can be reduced in size such that miniaturization requirement for electronic products can be met. In addition, the electrical contact pad of the present invention can be a conductive pillar. Whereby the electronic device of the present invention is of improved flexibility in structural design.

BRIEF DESCRIPTION OF DRAWINGS

FIGS. 2A-2G are cross-sectional views of an electronic device and a method of fabricating the same in accordance with the present invention, wherein FIGS. 2G' and 2G" are other implementation aspects of FIG. 2G; and FIGS. 3A-3C are schematic comparison diagrams of substrates of the electronic devices in accordance with the prior art and the present invention, wherein FIG. 3A is a plan view of the substrate of the electronic device in accordance with the prior art, FIG. 3B is a plan view of the substrate of the electronic device in accordance with the present invention, and FIG. 3C is a schematic view showing a difference in size between the substrate of the present invention and that of the prior art in light of FIGS. 3A and 3B.

DETAILED DESCRIPTION OF PREFERRED EMBODIMENTS

The following specific embodiments are disposed to illustrate the disclosure of the present invention, these and other advantages and effects can be apparently understood by those in the art after reading the disclosure of this specification.

Figure 1:
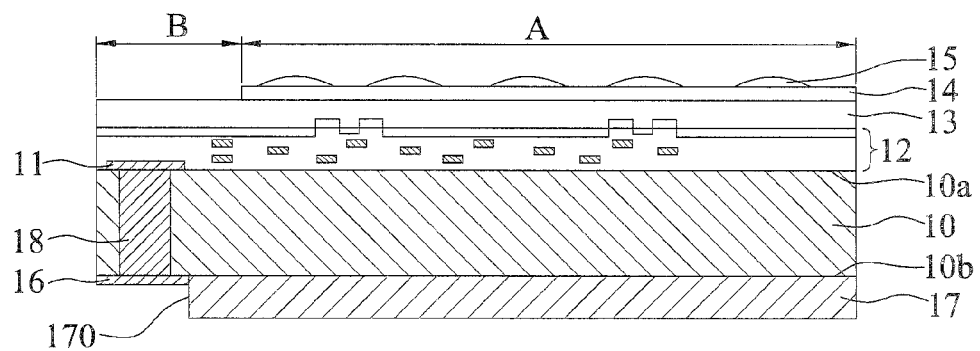
FIG. 1 is a cross-sectional view of an electronic device such as a CMOS image sensor in accordance with the prior art.
Figure 2A:
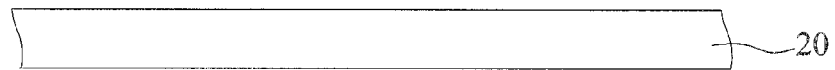

Referring to FIGS. 2A-2G, cross-sectional views of an electronic device and a method of fabricating the same in accordance with the present invention are shown, wherein FIGS. 2G' and 2G" are other implementation aspects of FIG. 2G.

As illustrated in FIG. 2A, a silicon substrate 20 is provided.

Figure 2B:

As illustrated in FIG. 2B, a photodiode layer 21 is formed on the silicon substrate 20. The photodiode layer 21 can be made of amorphous silicon.

Figure 2C:
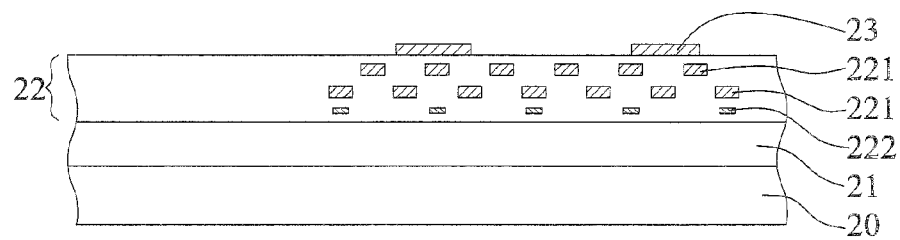

As illustrated in FIG. 2C, a wiring layer 22 is formed on the photodiode layer 21. The wiring layer 22 comprises a plurality of wires 221 spaced apart from each other and disposed in a special arrangement and a plurality of transfer gates 222 disposed at positions proximate to the photodiode layer 21. A plurality of electrical contact pads 23 are formed on the wiring layer 22 and electrically connected to the wires 221.

Figure 2D:
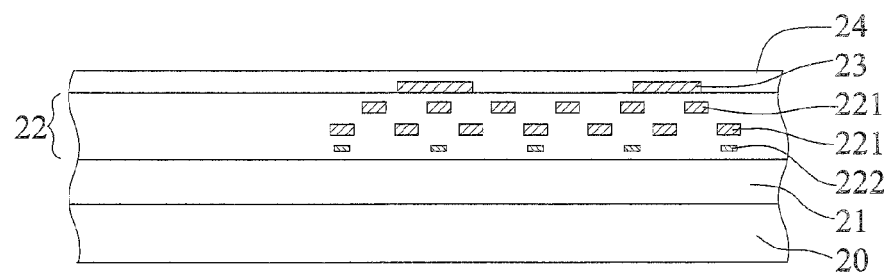
Figure 2D:
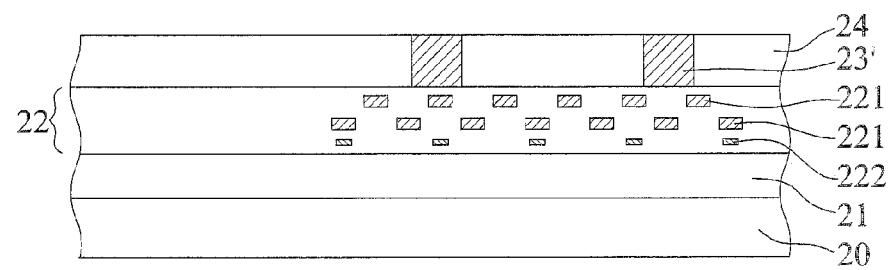

As illustrated in FIG. 2D, a passivation layer 24 is formed on the wiring layer 22 and the electrical contact pads 23. The passivation layer 24 can be made of silicon oxide, epitaxial silicon, or polyimide. A planarization process can be further performed to the passivation layer 24 after the passivation layer 24 is formed.

Figure 2E:
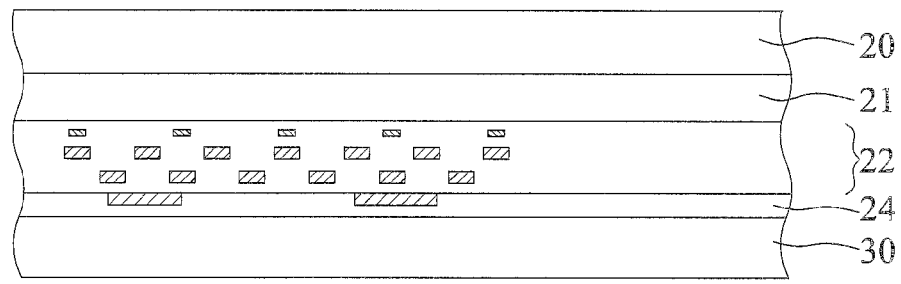
Figure 2E:
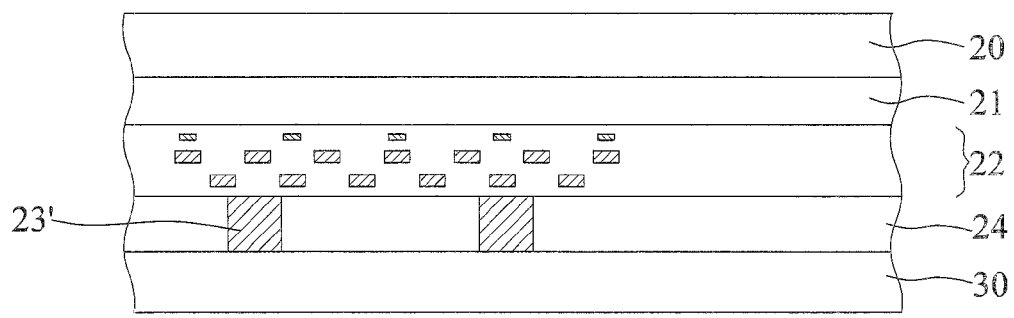

As illustrated in FIG. 2E, a carrier board 30 is attached to the passivation layer 24.

In addition, as shown in FIG. 2D' and FIG. 2E', the electrical contact pads 23' are formed on the wiring layer 22, and are in a shape of a pillar. After the planarization process is performed, the electrical contact pads 23' penetrate through the passivation layer 24, such that the electrical contact pads 23' are exposed from the passivation layer 24.

Figure 2F:
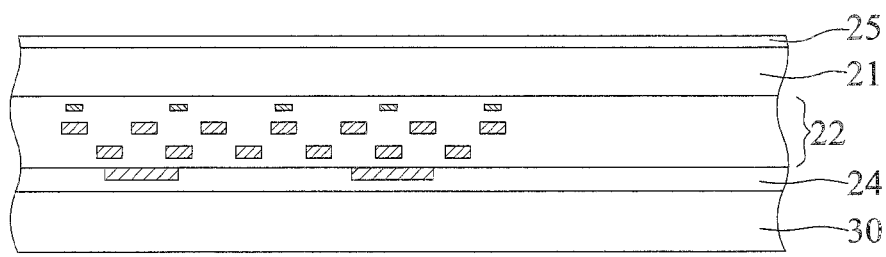

As illustrated in FIG. 2F, the silicon substrate 20 is removed; and an antireflective layer 25 is formed on the photodiode layer 21.

As illustrated in FIG. 2G, a color filter layer 26 is formed on the antireflective layer 25; a dielectric layer 27 is formed on the antireflective layer 25 and the color filter layer 26; and a microlens layer 28 is formed on the dielectric layer 27. The region formed with the color filter layer 26, the dielectric layer 27, and the microlens layer 28 is defined as an active region A. The electrical contact pads 23 are positioned within the active region A.

As illustrated in FIG. 2G' which is another implementation aspect of FIG. 2G, the electrical contact pads 23 are embedded in the wiring layer 22 and exposed from a surface of the wiring layer 22.

As illustrated in FIG. 2G", which shows a continuous fabrication of FIG. 2E' and is a further implementation aspect of FIG. 2G, the electrical contact pads 23' are in the shape of a pillar and penetrate through the passivation layer 24.

In light of the above, the electronic device provided by the present invention has; a photodiode layer 21 having corresponding first and second surface 21a, 21b; a wiring layer 22 formed on the first surface 21a of the photodiode layer 21, the wiring layer 22 comprising a plurality of wires 221 spaced apart from each other and disposed in a special arrangement and a plurality of transfer gates 222 disposed at positions proximate to the photodiode layer 21; a plurality of electrical contact pads 23 formed on the wiring layer 22 and electrically connected to the wires 221; a passivation layer 24 formed on the wiring layer 22 and the electrical contact pads 23; a carrier board 30 disposed on the passivation layer 24; an antireflective layer 25 formed on the second surface 21b of the photodiode layer 21; a color filter layer 26 formed on the antireflective layer 25; a dielectric layer 27 formed on the antireflective layer 25 and the color filter layer 26; and a microlens layer 28 formed on the dielectric layer 27, allowing a region formed with the color filter layer 26, the dielectric layer 27, and the microlens layer 28 to be defined as an active region A. The electrical contact pads 23 are positioned within the active region A.

In the above-mentioned electronic device, the electrical contact pads 23 can be embedded in the wiring layer 22 and exposed from a surface of the wiring layer 22. Alternatively, the electrical contact pads 23' are in the shape of a pillar and penetrate through the passivation layer 24.

In this embodiment, the photodiode layer 21 can be made of amorphous silicon, and the passivation layer 24 can be made of a material selected from the group consisting of silicon oxide, epitaxial silicon, and polyimide.

Figure 3A:
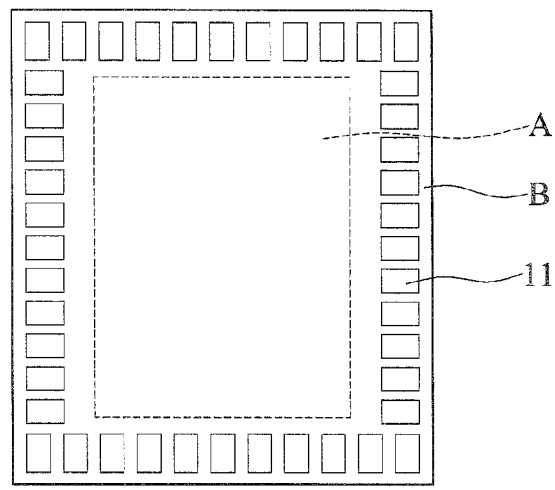
Figure 3B:
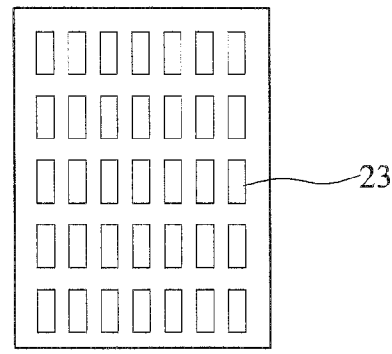
Figure 3C:
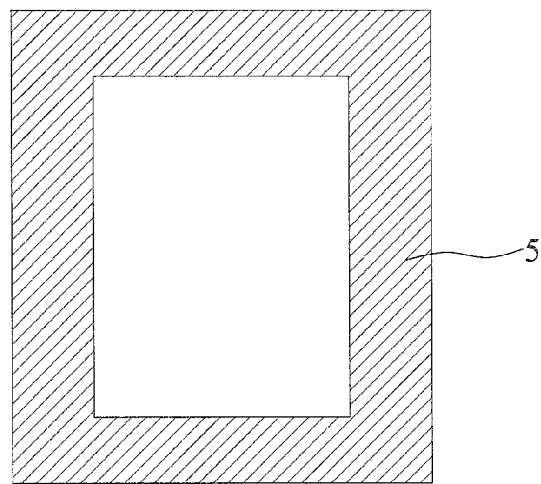

Referring to FIGS. 3A-3C, schematic diagrams of a difference in size or area between the substrate for the electronic device in accordance with the present invention and that in accordance with the prior art are shown. FIG. 3A is a plan view of the substrate of the electronic device in accordance with the prior art, FIG. 3B is a plan view of the substrate of the electronic device in accordance with the present invention, and FIG. 3C is a schematic view of the difference in size or area between FIG. 3A and FIG. 3B.

As illustrated in FIG. 3A, a plurality of first electrical contact pads 11 are formed in an inactive region B outside the active region A in accordance with the electronic device of the prior art. Therefore, the overall substrate area is the summation of the active region A and inactive region B.

As illustrated in FIG. 3B, the first electrical contact pads 23 (equivalent to the first electrical contact pads 11) are formed within the active region A in accordance with the electronic device of the present invention. Therefore, the overall area of the substrate (including the photodiode layer 21, the wire-disposing layer 22, the carrier board 30 and the like) equals to the area of the active region A and is thus smaller than that of the prior art substrate as illustrated in FIG. 3A.

As illustrated in FIG. 3C, an area difference 5 is equal the substrate area illustrated in FIG. 3A subtracted by the substrate area illustrated in FIG. 3B. As shown, the electronic device of the present invention is allowed to employ a substrate with a smaller size than the prior art and thus the cost for fabricating the same is reduced.

In conclusion, compared with the prior art, the electrical contact pads of the electronic device of the present invention are positioned within the active region, such that the area of the substrate for the inactive region becomes unnecessary and can thus be eliminated. Further, the size of the electronic device can be reduced due to the reduced size of the substrate, and thus can meet the miniaturization requirement for electronic products. In addition, the electrical contact pads of the present invention can be conductive pillars, whereby the electronic device of the present invention is flexible in structural design.

The above-mentioned embodiments are used to exemplarily illustrate the principles and effects of the present invention and are not restrictive of the scope of the present invention. One skilled in the art could modify the above-mentioned embodiments without violating the spirit and scope of the present invention. Hence, the protected scope of the present invention should fall within the following appended claims.

What is claimed is:

1. A method of fabricating an electronic device, comprising the steps of:

forming a photodiode layer on a silicon substrate;

forming a wiring layer on the photodiode layer, the wire-disposing layer comprising a plurality of wires spaced apart from each other and disposed in a special arrangement and a plurality of transfer gates disposed at positions proximate to the photodiode layer;

forming a plurality of electrical contact pads on the wiring layer and electrically connecting the electrical contact pads to the wiring layer;

forming a passivation layer on the wiring layer and the electrical contact pads;

attaching a carrier board on the passivation layer;

removing the silicon substrate;

forming an antireflective layer on the photodiode layer;

forming a color filter layer on the antireflective layer;

forming a dielectric layer on the antireflective layer and the color filter layer; and forming a microlens layer on the dielectric layer, allowing the color filter layer, the dielectric layer and the microlens layer to define an active region within which the electrical contact pads are positioned.

2. The method of claim 1, wherein the electrical contact pads are embedded in the wiring layer and exposed from a surface of the wiring layer.

3. The method of claim 1, wherein the photodiode layer is made of amorphous silicon.

4. The method of claim 1, wherein the electrical contact pads are in the shape of a pillar and penetrate through the passivation layer.

5. The method of claim 1, wherein the passivation layer is made of a material selected from the group consisting of silicon oxide, epitaxial silicon, and polyimide.

6. The method of claim 1, further comprising performing a planarization process to the passivation layer after forming the passivation layer.

* * * * *